United States Patent [19]

DasGupta et al.

[11] Patent Number: 5,787,098
[45] Date of Patent: Jul. 28, 1998

[54] COMPLETE CHIP I/O TEST THROUGH LOW CONTACT TESTING USING ENHANCED BOUNDARY SCAN

[75] Inventors: Sumit DasGupta, Austin, Tex.; Kris Venkatraman Srikrishnan, Wappingers Falls, N.Y.; Ronald Gene Walther, Austin, Tex.

[73] Assignee: International Business Machines Corporation, Armonk, N.Y.

[21] Appl. No.: 688,067

[22] Filed: Jul. 29, 1996

[51] Int. Cl.⁶ .................................................. G01R 31/28
[52] U.S. Cl. .................. 371/22.3; 371/22.31; 371/22.32; 324/765
[58] Field of Search ..................... 371/22.3, 22.1, 371/22.32, 22.31, 22.5; 324/76.11, 715, 765, 537, 538; 156/654, 659.1; 377/70; 395/183.06; 368/118; 326/86; 257/48

[56] References Cited

U.S. PATENT DOCUMENTS

| | | | |
|---|---|---|---|
| 4,180,772 | 12/1979 | Buelow et al. | 324/73 PC |
| 4,441,075 | 4/1984 | McMahon | 324/73 R |
| 4,495,628 | 1/1985 | Zasio | 377/70 |
| 4,703,484 | 10/1987 | Rolfe et al. | 371/25 |
| 4,782,283 | 11/1988 | Zasio | 324/73 R |
| 4,875,003 | 10/1989 | Burke | 324/73 R |
| 4,894,605 | 1/1990 | Ringleb et al. | 324/537 |
| 4,967,142 | 10/1990 | Sauerwald et al. | 324/73.1 |
| 5,070,296 | 12/1991 | Priebe | 324/73.1 |
| 5,115,191 | 5/1992 | Yoshimori | 324/158 R |
| 5,150,047 | 9/1992 | Saito et al. | 324/158 R |
| 5,208,531 | 5/1993 | Aton | 324/158 R |
| 5,326,428 | 7/1994 | Farnworth et al. | 156/654 |
| 5,406,210 | 4/1995 | Pedder | 324/757 |
| 5,457,381 | 10/1995 | Farwell | 324/158.1 |

*Primary Examiner*—Robert W. Beausoliel, Jr.
*Assistant Examiner*—Nadeem Iqbal
*Attorney, Agent, or Firm*—Casimer K. Salys

[57] ABSTRACT

A system and method for evaluating solder ball connections to a flip-chip or the like integrated circuit device through an extension of boundary scan testing circuits and techniques. The existence, size, and connective efficacy of solder balls deposited on pads are indirectly verified through the inclusion of a boundary scan driver and receiver with each pad. The respective drivers and receivers are connected to the complementing sections of a segmented pad metallurgy. The formation of a correct size solder ball connects the driver and receiver to allow boundary scan verification of all the electrical connections in the path. Thereby, low contact testing can be used to verify the integrity of the integrated circuit as well as any solder ball type die (chip) output contacts.

6 Claims, 3 Drawing Sheets

COMPLETE CHIP I/O TEST THROUGH LOW CONTACT TESTING USING ENHANCED BOUNDARY SCAN

FIELD OF THE INVENTION

The present invention relates generally to apparatus and methods which facilitate the testing of integrated circuit devices. More particularly, the invention is directed to refinements which extend boundary scan testing to test the quality of solder connections in solder ball grid array integrated circuit device packages.

BACKGROUND OF THE INVENTION

The cost of test equipment used to evaluate the operability and performance of integrated circuit chips is determined to a large extent by the number of input/output (I/O) connections that must be probed, controlled, and measured by the tester. Integrated circuit chips with high I/O counts are difficult to probe during wafer testing given the close I/O pad spacing. The problems are further exaggerated by the need to apply enough test probe pressure to ensure that all I/O pads are electrically connected, a requirement that may not be possible without damaging integrated circuit devices while in wafer form.

To overcome the cost and complexity of testing large numbers of I/O connections, a technology generally identified as "low-contact" testing has evolved. Integrated circuit die are tested by probing a small subset of the I/O connections with the functionality of the remaining unprobed I/O connections derived from die functions. The prevailing practice of the low contact test strategy involves the use of boundary scan testing, whereby unprobed I/O pads are evaluated using both an off chip driver (OCD) and an on chip receiver (OCR) with each I/O pad. The signal path defined through the OCD and OCR verifies the functionality even though direct probing of the I/O pad is never accomplished by the test equipment.

Though the use of OCD and OCR circuits verify the presence of the signal loop, common implementations do not extend the signal through the I/O pad structure itself. Furthermore, with the trend toward ball grid array technology, and in particular IBM's controlled collapse chip connection (C4) technology as applied to individual integrated circuit die (chips), there has arisen a need for the capability to test for the presence and effectiveness of solder balls deposited on the individual I/O pad sites.

SUMMARY OF THE INVENTION

According to a practice of the present invention, the efficacy of solder deposited on a selected input/output pad is evaluated in the context of integrated circuit test utilizing boundary scan test as applied to an array of pads using an off chip driver means connected by a first electrical line to a first portion of the pad, an off chip receiver means connected by a second electrical line to a second portion of the pad, the second portion of the pad being electrically distinct from the first portion of the pad, a solder deposit formed over the first and second portions of the pad, and means for the off chip receiver means to generate an output signal responsive to the transmission of a signal by the off chip driver means in the presence of an electrical connection from the solder deposit to both the first and second portions of the pad.

In another form, the invention relates to a process whereby in an integrated circuit utilizing boundary scan testing to evaluate an array of input/output pads for solder deposit connection efficacy, the evaluation being accomplished through the steps of forming a pad having a first and a second portion, the first and second portions being electrically distinct, connecting the first portion of a pad to an off chip driver using a first electrical line, connecting the second portion of the pad to an off chip receiver using a second electrical line, forming a solder deposit over the first and second portions of the pad, generating a signal by the off chip driver on the first electrical line responsive to an input scan signal, and generating an output signal by the off chip receiver responsive to the signal on the first electrical line when an electrical connection exists from the solder deposit to both the first and second portions of the pad.

In a particularized practice of the invention, each solder ball connection subject to test includes an off chip driver and an off chip receiver. The output line of the off chip driver is connected to a portion of the I/O pad. Similarly, the input to the off chip receiver is likewise connected to a different portion of the pad, this portion being electrically separated from the other portion as a consequence of a small dielectric filled gap between the portions of the pad. The existence of a solder ball of correct size and electrical continuity joins the two pad portions and thereby electrically connects the off chip driver to the off chip receiver. Once so connected, the driver and receiver can function in normal boundary scan mode and thereby effectuate a test of all input/output characteristics, including the electrical integrity of the solder ball connections.

These and other features of the invention will be more clearly understood and appreciated upon considering the detailed embodiments which follow hereinafter.

DESCRIPTION OF THE PREFERRED EMBODIMENT

Figure 1:
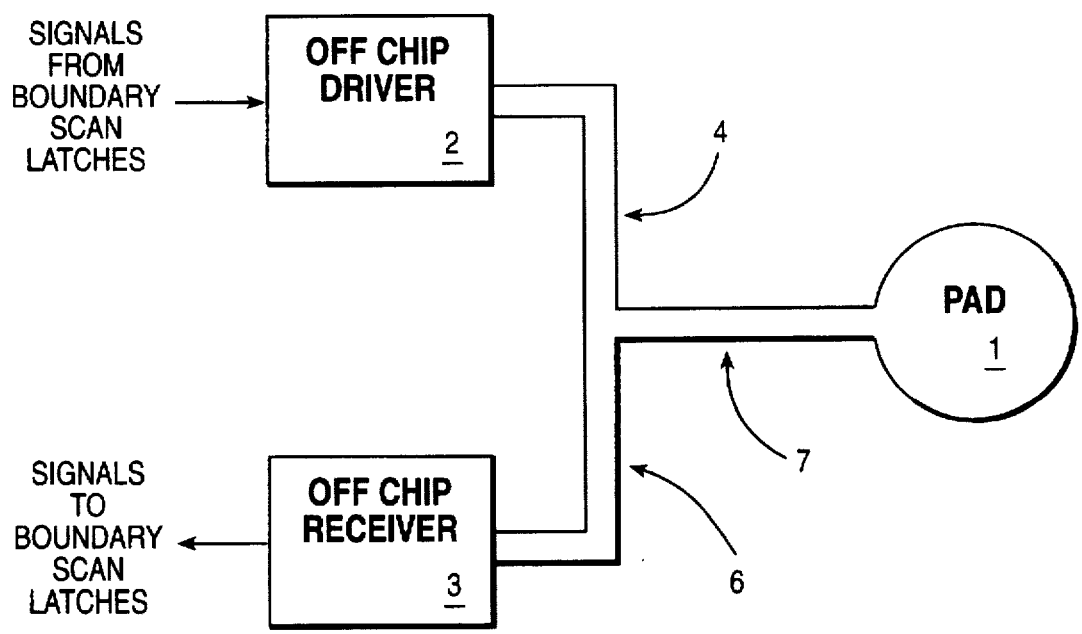
FIG. 1 is a schematic diagram of a conventional boundary scan I/O interconnect wiring pattern.

FIG. 1 schematically illustrates the conventional input/output configuration of an integrated circuit pad suited for boundary scan testing. The depiction illustrates the typical wiring pattern pad which is tested indirectly, through the boundary scan rather than by physical contact to the circular pad 1 or its metallization. In the context of FIG. 1, boundary scan signals enter off chip driver 2 and are detected as output signals from off chip receiver 3. For the scan signals to propagate from the input of off chip driver 2 to the output of off chip receiver 3, not only must driver 2 and receiver 3 be operational, but conductive line segments 4 and 6 must exist. In such context, successful scan test presupposes that line segment 7 and pad 1 of the integrated circuit metalization are present and connected. Foremost, with the trend toward ball grid array solder ball packaging connection technology the implementation of FIG. 1 also would have to presume that the hemisphere shaped solder ball is electrically bonded to pad 1. Likewise as to any intervening metallurgy layer, generally referred to as ball limiting metallurgy, which is often formed over and substantially coextensive with pad 1. Therefore, low contact boundary scan testing of conventional form fails to evaluate the existence of metalization line segments, such as 7, pad 1 metalization, ball limiting metallurgy formations, an electrically connected solder ball, or a solder ball of appropriate size.

Figure 2:
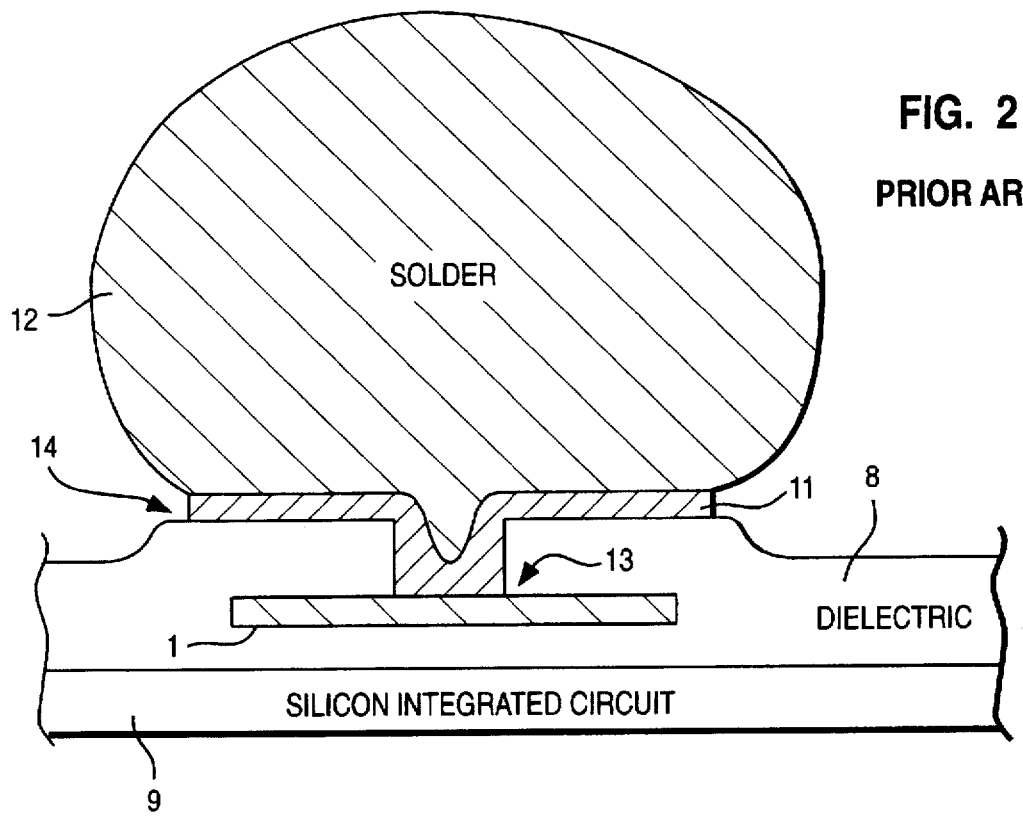
FIG. 2 is a schematic cross section of a conventional I/O pad with a solder ball.

FIG. 2 illustrates by schematic cross section a ball grid array solder ball attached to an integrated circuit die as typical of a flip-chip device. Pad 1 is covered with a layer of dielectric 8 which has a contact hole etched at location 13. Ball limiting metallurgy 11 is formed over dielectric 8 and in the hole at 13 using a pattern which substantially matches pad 1. Solder 12 deposited on metallurgy 11 is preferably high melting temperature solder of 90/10 composition lead/tin.

As noted earlier with reference to FIGS. 1 and 2, low contact boundary scan testing fails to evaluate the existence or correct size of multiple structural features, such as line 7, pad 1, metallurgy 11 and solder ball 12. Furthermore, the low contact boundary scan test technique fails to evaluate the electrical connections between the various conductive materials, such as the connection at 13 between pad 1 and metallurgy 11, and connection at 14 between metallurgy 11 and solder ball 12. With the trend toward smaller dimensions and more manufacturing automation, such as the use of solder droplet ejection equipment to deposit solder balls 12, there is an accentuated need for refinements to boundary scan low contact testing which detect manufacturing defects before the flip chip devices are attached to modules or printed circuit boards.

Figure 3:
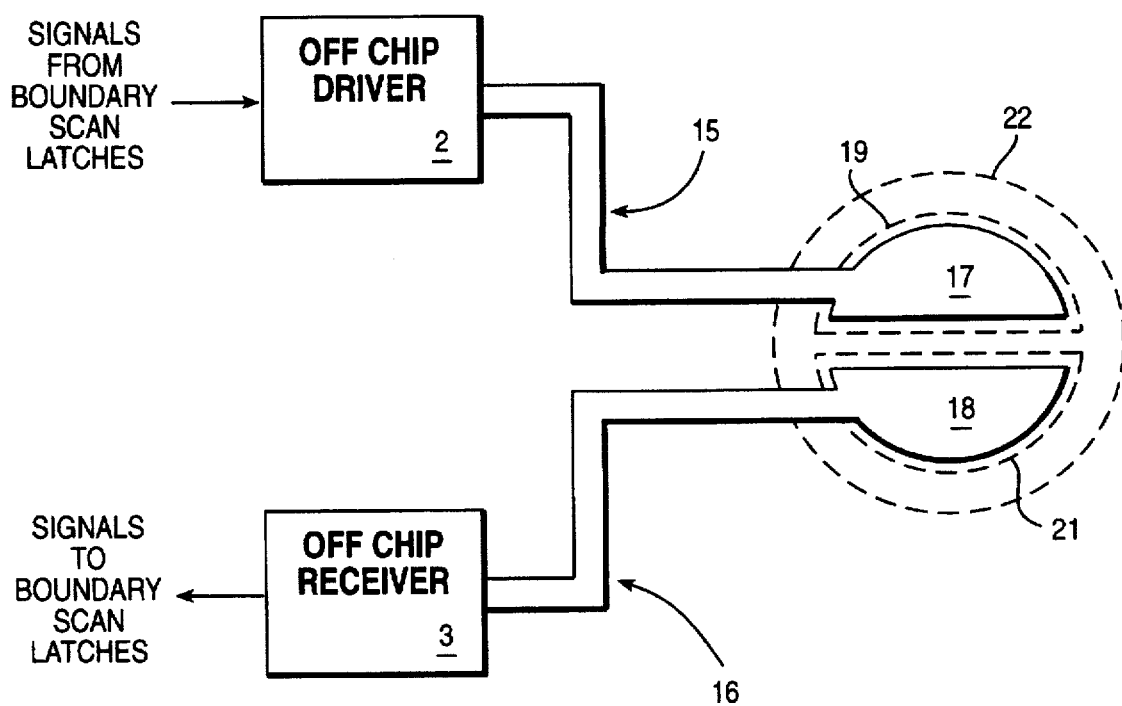
FIG. 3 is a schematic representation of the I/O pad connection according to the present invention including the solder ball connection test capability.
Figure 4:
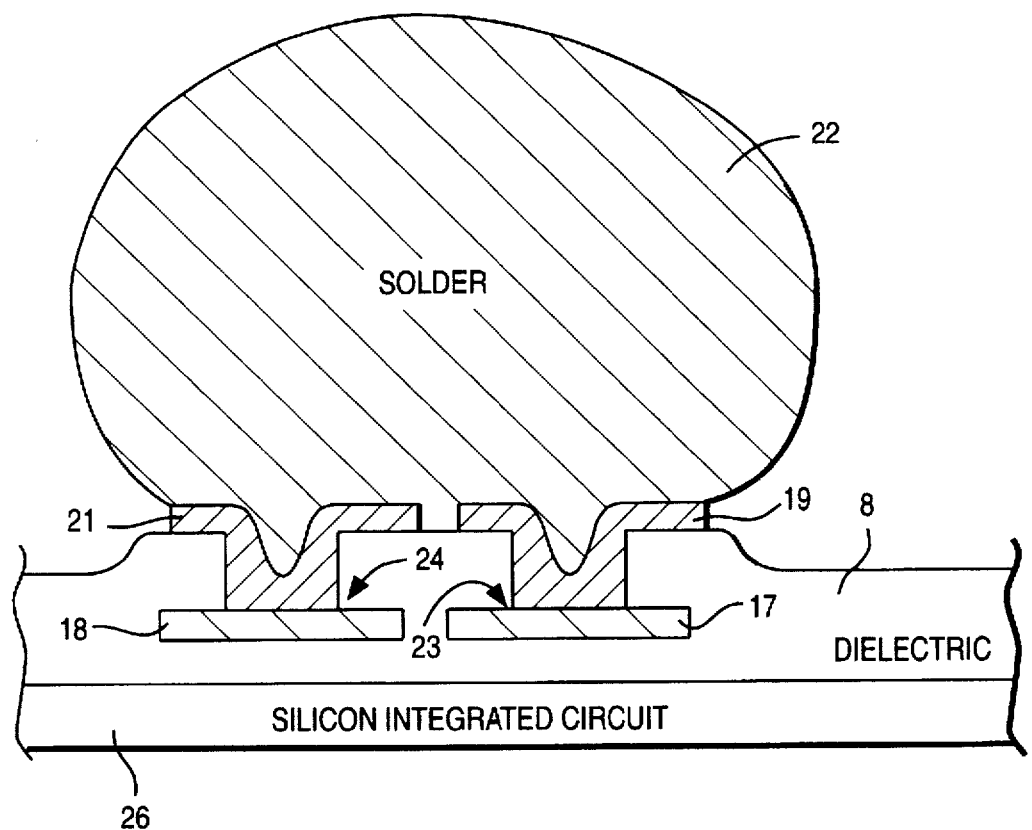
FIG. 4 is a schematic cross section of a solder ball and pad structure connected according to the present invention connected to provide boundary scan testing.

FIGS. 3 and 4 schematically illustrate an application of the invention to accentuate the effectiveness of the boundary scan test so as to encompass aspects of the pad, the ball limiting metallurgy and the solder ball. As shown in FIG. 3, off chip driver 2 is connected by metalization line 15 directly to pad portion 17. Complementing pad portion 18 is connected through metalization line 16 to off chip receiver 3. Note that in the absence of any conductive connection between pad portions 17 and 18, off chip driver 2 is not electrically connected to off chip receiver 3. Similarly, ball limiting metallurgy 19, substantially overlaying pad portion 17, and ball limiting metallurgy 21, substantially overlaying pad portion 18, are electrically connected to the respective pad portions but electrically isolated from one another. The relative locations of metallurgy 19 and 21 with reference to corresponding pad portions 17 and 18 are shown by dashed lines in FIG. 3. The electrical connection between off chip driver 2 and off chip receiver 3 is completed only when solder ball 22 is formed as shown by dashed lines in FIG. 3 and by cross section in FIG. 4.

In considering the embodiment described with reference to FIGS. 3 and 4, note that low contact boundary scan testing performed on the structure, whether that be in a wafered state or by individual die, verifies the existence of metalization lines 15 and 16, the existence of pad portions 17 and 18, the existence of metallurgy 19 and 21, the existence of solder ball 22, the required minimum correct size of solder ball 22, and the electrical continuity between solder ball 22 and respective pad portions 17 and 18 through metallurgy 19 and 21.

The embodiment described and illustrated with reference to FIGS. 3 and 4 shows a pad composed of two semicircles. That may not always be the ideal pad shape in that the surface tension of solder 22 influences how solder 22 wicks to the metallurgy in relation to the size of the solder ball. For instance, preliminary consideration indicates that a "bulls eye" arrangement, in which one portion of the pad forms the center and the other portion forms an outer ring, may define a structure with good wicking characteristics. That pattern attracts the solder ball toward the center while making connection to the outer ring only if the ball is of suitable size. Since metallurgy 19 and 21 connects through contacts at 23 and 24 and to pad portions 17 and 18, the pads and metallurgy may differ in shape. Therefore, the shape of the pad portions, as well as the shape of the related metallurgy, will likely be dictated by the parameters of the application, including, but not limited to, the composition of the metallurgy, the composition of the solder, and the dimensions ascribed to the various materials.

Figure 5:
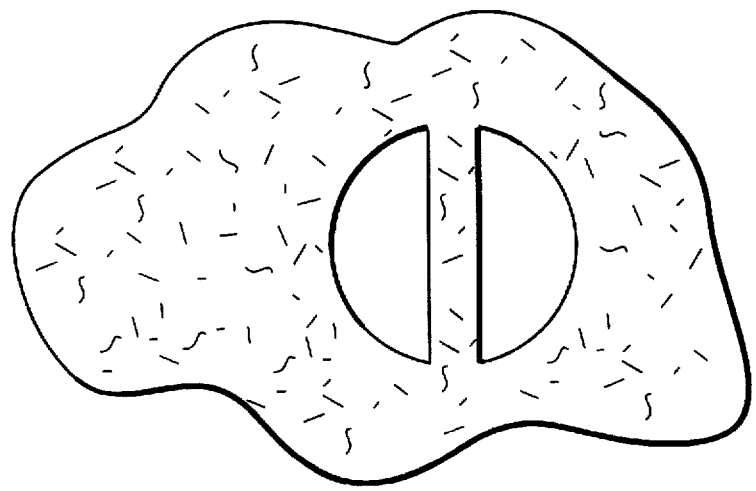
FIG. 5 is a schematic depicting an etch mask for defining the metallurgy.

The embodiment in FIG. 4 presumes off chip driver 2 and off chip receiver 3 (FIG. 3) are formed in silicon integrated circuit 26. Pad portions 17 and 18 are formed in the final metal layer within the dielectric deposits of silicon dioxide or polyamide. Patterned metallurgy 19 and 21 is preferably composed of sandwiched layers using chrome and copper. Conventional photolithographic patterning and etching with photoresist is employed. A photolithographic mask such as depicted in FIG. 5 can be used to define the metallurgy onto which the solder is deposited.

Solder ball 22 may be formed by vapor deposition, or may be the outcome of advanced solder injection techniques using either individual microscopic solder balls or a transfer mask. The shape of the solder formation, whether formed by mask or direct injection, is preferably circular. Wicking of each solder ball 22 during reflow ensures continuity between metallurgy and related pad segments.

It will be understood by those skilled in the art the embodiments set forth hereinbefore are merely exemplary of the numerous arrangements by which the invention may be practiced, and as such may be replaced by equivalents without departing from the invention which will now be defined by appended claims.

We claim:

1. In an integrated circuit utilizing boundary scan testing and an array of pads for input/output connection, apparatus for evaluating the connection efficacy of solder deposited on a selected pad, comprising:

an off chip driver means connected by a first electrical line to a first portion of the pad;

an off chip receiver means connected by a second electrical line to a second portion of the pad, the second portion of the pad being electrically distinct from the first portion of the pad;

a solder deposit formed to connect to the first and second portions of the pad; and means for the off chip receiver means to generate an output signal responsive to the transmission of a signal by the off chip driver means in the presence of an electrical connection from the solder deposit to both the first and second portions of the pad.

2. The apparatus recited in claim 1, wherein the solder deposit is one unit of a ball grid array.

3. The apparatus recited in claim 2, wherein the off chip driver means is responsive to a boundary scan input signal and the off chip receiver means generates an output signal whose state is detectable by boundary scan testing.

4. In an integrated circuit utilizing boundary scan testing and an array of pads for input/output connection, a method of evaluating the efficacy of solder deposited on a selected pad, comprising the steps of:

forming a pad having a first and a second portion, the first and second portions being electrically distinct;

connecting the first portion of the pad to an off chip driver using a first electrical line;

connecting the second portion of the pad to an off chip receiver using a second electrical line;

forming a solder deposit to connect to the first and second portions of the pad;

generating a signal by the off chip driver on the first electrical line responsive to an input scan signal; and generating an output signal by the off chip receiver responsive to the signal on the first electrical line when an electrical connection exists from the solder deposit to both the first and second portions of the pad.

5. The method recited in claim 4, wherein the solder deposit formed over the first and second portions of the pad is one unit of a ball grid array.

6. The method recited in claim 5, wherein the output signal generated by the off chip receiver is detected by boundary scan testing.

* * * * *